(12) United States Patent
Khoshnevisan et al.

(10) Patent No.: US 11,438,826 B2
(45) Date of Patent: Sep. 6, 2022

(54) USING A PRE-EMPTION INDICATION ASSOCIATED WITH A QUASI CO-LOCATION RELATIONSHIP

(71) Applicant: QUALCOMM Incorporated, San Diego, CA (US)

(72) Inventors: Mostafa Khoshnevisan, San Diego, CA (US); Jing Sun, San Diego, CA (US); Xiaoxia Zhang, San Diego, CA (US); Tao Luo, San Diego, CA (US); Arumugam Chendamarai Kannan, San Diego, CA (US)

(73) Assignee: QUALCOMM Incoporated, San Diego, CA (US)

( * ) Notice: Subject to any disclaimer, the term of this patent is extended or adjusted under 35 U.S.C. 154(b) by 53 days.

(21) Appl. No.: 16/715,727

(22) Filed: Dec. 16, 2019

(65) Prior Publication Data
US 2020/0205059 A1 Jun. 25, 2020

Related U.S. Application Data

(60) Provisional application No. 62/782,212, filed on Dec. 19, 2018.

(51) Int. Cl.
*H04W 48/12* (2009.01)
*H04W 72/04* (2009.01)
(Continued)

(52) U.S. Cl.
CPC ....... *H04W 48/12* (2013.01); *H03M 13/3927* (2013.01); *H04B 1/7115* (2013.01);
(Continued)

(58) Field of Classification Search
CPC ... H04B 7/0626; H04L 5/0023; H04L 5/0048; H04L 5/0051; H04L 5/0053; H04W 72/042
See application file for complete search history.

(56) References Cited

U.S. PATENT DOCUMENTS

2018/0279326 A1 9/2018 Park et al.
2019/0222284 A1 7/2019 Huang
(Continued)

FOREIGN PATENT DOCUMENTS

WO 2020023536 A2 1/2020

OTHER PUBLICATIONS

International Search Report and Written Opinion—PCT/US2019/066860—ISA/EPO—ISA/EPO—dated Mar. 16, 2020.

*Primary Examiner* — Ayaz R Sheikh
*Assistant Examiner* — Debebe A Asefa
(74) *Attorney, Agent, or Firm* — Harrity & Harrity LLP

(57) ABSTRACT

In some aspects, a user equipment (UE) may receive a configuration that indicates an association between a pre-emption indication field and at least one of: a set of transmission configuration indicator (TCI) states, a set of demodulation reference signal (DMRS) ports, or a set of layers; receive downlink control information (DCI) that includes a pre-emption indication that is indicated as a set of bits in the pre-emption indication field; determine whether the UE is scheduled to receive a communication in one or more pre-empted resources indicated by the set of bits, via a component carrier associated with the pre-emption indication, and using at least one of: a TCI state included in the set of TCI states, a DMRS port included in the set of DMRS ports, or a layer included in the set of layers; and decode the communication based at least in part on the determination.

30 Claims, 8 Drawing Sheets

(51) Int. Cl.
*H04L 5/00* (2006.01)
*H04W 24/10* (2009.01)
*H04L 27/26* (2006.01)
*H04B 1/7115* (2018.01)
*H04W 76/27* (2018.01)
*H03M 13/39* (2006.01)
*H04B 7/06* (2006.01)

(52) U.S. Cl.
CPC ......... *H04B 7/0626* (2013.01); *H04L 5/0053* (2013.01); *H04L 5/0094* (2013.01); *H04L 27/2613* (2013.01); *H04W 24/10* (2013.01); *H04W 72/042* (2013.01); *H04W 76/27* (2018.02)

(56) References Cited

U.S. PATENT DOCUMENTS

| | | | | |
|---|---|---|---|---|
| 2019/0246395 A1* | 8/2019 | Huang | .............. | H04W 72/0446 |
| 2019/0379491 A1* | 12/2019 | Kilinc | ................... | H04L 1/1896 |
| 2020/0077470 A1* | 3/2020 | Xiong | ................... | H04L 1/1854 |
| 2021/0076324 A1* | 3/2021 | Kaikkonen | ........... | H04W 24/08 |

* cited by examiner

USING A PRE-EMPTION INDICATION ASSOCIATED WITH A QUASI CO-LOCATION RELATIONSHIP

CROSS-REFERENCE TO RELATED APPLICATION

This application claims priority to U.S. Provisional Patent Application No. 62/782,212, filed on Dec. 19, 2018, entitled "USING A PRE-EMPTION INDICATION ASSOCIATED WITH A QUASI CO-LOCATION RELATIONSHIP," which is hereby expressly incorporated by reference herein.

BACKGROUND

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power, and/or the like). Examples of such multiple-access technologies include code division multiple access (CDMA) systems, time division multiple access (TDMA) systems, frequency-division multiple access (FDMA) systems, orthogonal frequency-division multiple access (OFDMA) systems, single-carrier frequency-division multiple access (SC-FDMA) systems, time division synchronous code division multiple access (TD-SCDMA) systems, and Long Term Evolution (LTE). LTE/LTE-Advanced is a set of enhancements to the Universal Mobile Telecommunications System (UMTS) mobile standard promulgated by the Third Generation Partnership Project (3GPP).

A wireless communication network may include a number of base stations (BSs) that can support communication for a number of user equipment (UEs). A user equipment (UE) may communicate with a base station (BS) via the downlink and uplink. The downlink (or forward link) refers to the communication link from the BS to the UE, and the uplink (or reverse link) refers to the communication link from the UE to the BS. As will be described in more detail herein, a BS may be referred to as a Node B, a gNB, an access point (AP), a radio head, a transmit receive point (TRP), a new radio (NR) BS, a 5G Node B, and/or the like.

The above multiple access technologies have been adopted in various telecommunication standards to provide a common protocol that enables different user equipment to communicate on a municipal, national, regional, and even global level. New radio (NR), which may also be referred to as 5G, is a set of enhancements to the LTE mobile standard promulgated by the Third Generation Partnership Project (3GPP). NR is designed to better support mobile broadband Internet access by improving spectral efficiency, lowering costs, improving services, making use of new spectrum, and better integrating with other open standards using orthogonal frequency division multiplexing (OFDM) with a cyclic prefix (CP) (CP-OFDM) on the downlink (DL), using CP-OFDM and/or SC-FDM (e.g., also known as discrete Fourier transform spread OFDM (DFT-s-OFDM)) on the uplink (UL), as well as supporting beamforming, multiple-input multiple-output (MIMO) antenna technology, and carrier aggregation. However, as the demand for mobile broadband access continues to increase, there exists a need for further improvements in LTE and NR technologies. Preferably, these improvements should be applicable to other multiple access technologies and the telecommunication standards that employ these technologies.

SUMMARY

In some aspects, a method of wireless communication, performed by a UE, may include receiving a configuration that indicates an association between a pre-emption indication field and at least one of: a set of transmission configuration indicator (TCI) states, a set of demodulation reference signal (DMRS) ports, or a set of layers; receiving downlink control information (DCI) that includes a pre-emption indication that is indicated as a set of bits in the pre-emption indication field; determining whether the UE is scheduled to receive a communication in one or more pre-empted resources indicated by the set of bits, via a component carrier associated with the pre-emption indication, and using at least one of: a TCI state included in the set of TCI states, a DMRS port included in the set of DMRS ports, or a layer included in the set of layers; and decoding the communication based at least in part on the determination.

In some aspects, a UE for wireless communication may include memory and one or more processors operatively coupled to the memory. The memory and the one or more processors may be configured to receive a configuration that indicates an association between a pre-emption indication field and at least one of: a set of TCI states, a set of DMRS ports, or a set of layers; receive DCI that includes a pre-emption indication that is indicated as a set of bits in the pre-emption indication field; determine whether the UE is scheduled to receive a communication in one or more pre-empted resources indicated by the set of bits, via a component carrier associated with the pre-emption indication, and using at least one of: a TCI state included in the set of TCI states, a DMRS port included in the set of DMRS ports, or a layer included in the set of layers; and decode the communication based at least in part on the determination.

In some aspects, a non-transitory computer-readable medium may store one or more instructions for wireless communication. The one or more instructions, when executed by one or more processors of a UE, may cause the one or more processors to receive a configuration that indicates an association between a pre-emption indication field and at least one of: a set of TCI states, a set of DMRS ports, or a set of layers; receive DCI that includes a pre-emption indication that is indicated as a set of bits in the pre-emption indication field; determine whether the UE is scheduled to receive a communication in one or more pre-empted resources indicated by the set of bits, via a component carrier associated with the pre-emption indication, and using at least one of: a TCI state included in the set of TCI states, a DMRS port included in the set of DMRS ports, or a layer included in the set of layers; and decode the communication based at least in part on the determination.

In some aspects, an apparatus for wireless communication may include means for receiving a configuration that indicates an association between a pre-emption indication field and at least one of: a set of TCI states, a set of DMRS ports, or a set of layers; means for receiving DCI that includes a pre-emption indication that is indicated as a set of bits in the pre-emption indication field; means for determining whether the apparatus is scheduled to receive a communication in one or more pre-empted resources indicated by the set of bits, via a component carrier associated with the pre-emption indication, and using at least one of: a TCI state included in the set of TCI states, a DMRS port included in the set of DMRS ports, or a layer included in the set of layers; and means for decoding the communication based at least in part on the determination.

In some aspects, a method of wireless communication, performed by a base station, may include transmitting a configuration that indicates an association between a pre-emption indication field and at least one of a set of TCI states, a set of DMRS ports, or a set of layers; determining that a scheduled communication, associated with at least one of a TCI state of the set of TCI states, a DMRS port of the set of DMRS ports, or a layer of the set of layers, is pre-empted for a UE; and transmitting downlink control information (DCI) that includes a pre-emption indication, that is indicated as a set of bits in the pre-emption indication field, based at least in part on the determination, wherein the pre-emption indication indicates one or more pre-empted resources in which the scheduled communication is pre-empted for the UE.

In some aspects, a base station for wireless communication may include memory and one or more processors operatively coupled to the memory. The memory and the one or more processors may be configured to transmit a configuration that indicates an association between a pre-emption indication field and at least one of a set of TCI states, a set of DMRS ports, or a set of layers; determine that a scheduled communication, associated with at least one of a TCI state of the set of TCI states, a DMRS port of the set of DMRS ports, or a layer of the set of layers, is pre-empted for a UE; and transmit DCI that includes a pre-emption indication, that is indicated as a set of bits in the pre-emption indication field, based at least in part on the determination, wherein the pre-emption indication indicates one or more pre-empted resources in which the scheduled communication is pre-empted for the UE.

In some aspects, a non-transitory computer-readable medium may store one or more instructions for wireless communication. The one or more instructions, when executed by one or more processors of a base station, may cause the one or more processors to transmit a configuration that indicates an association between a pre-emption indication field and at least one of a set of TCI states, a set of DMRS ports, or a set of layers; determine that a scheduled communication, associated with at least one of a TCI state of the set of TCI states, a DMRS port of the set of DMRS ports, or a layer of the set of layers, is pre-empted for a UE; and transmit DCI that includes a pre-emption indication, that is indicated as a set of bits in the pre-emption indication field, based at least in part on the determination, wherein the pre-emption indication indicates one or more pre-empted resources in which the scheduled communication is pre-empted for the UE.

In some aspects, an apparatus for wireless communication may include means for transmitting a configuration that indicates an association between a pre-emption indication field and at least one of a set of TCI states, a set of DMRS ports, or a set of layers; means for determining that a scheduled communication, associated with at least one of a TCI state of the set of TCI states, a DMRS port of the set of DMRS ports, or a layer of the set of layers, is pre-empted for a UE; and means for transmitting downlink control information (DCI) that includes a pre-emption indication, that is indicated as a set of bits in the pre-emption indication field, based at least in part on the determination, wherein the pre-emption indication indicates one or more pre-empted resources in which the scheduled communication is pre-empted for the UE.

Aspects generally include a method, apparatus, system, computer program product, non-transitory computer-readable medium, user equipment, base station, wireless communication device, and processing system as substantially described herein with reference to and as illustrated by the accompanying drawings and specification.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purpose of illustration and description, and not as a definition of the limits of the claims.

BRIEF DESCRIPTION OF THE DRAWINGS

So that the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

Several aspects of telecommunication systems will now be presented with reference to various apparatuses and techniques. These apparatuses and techniques will be described in the following detailed description and illustrated in the accompanying drawings by various blocks, modules, components, circuits, steps, processes, algorithms, and/or the like (collectively referred to as "elements"). These elements may be implemented using hardware, software, or combinations thereof. Whether such elements are implemented as hardware or software depends upon the particular application and design constraints imposed on the overall system.

It is noted that while aspects may be described herein using terminology commonly associated with 3G and/or 4G wireless technologies, aspects of the present disclosure can be applied in other generation-based communication systems, such as 5G and later, including NR technologies.

Figure 1:
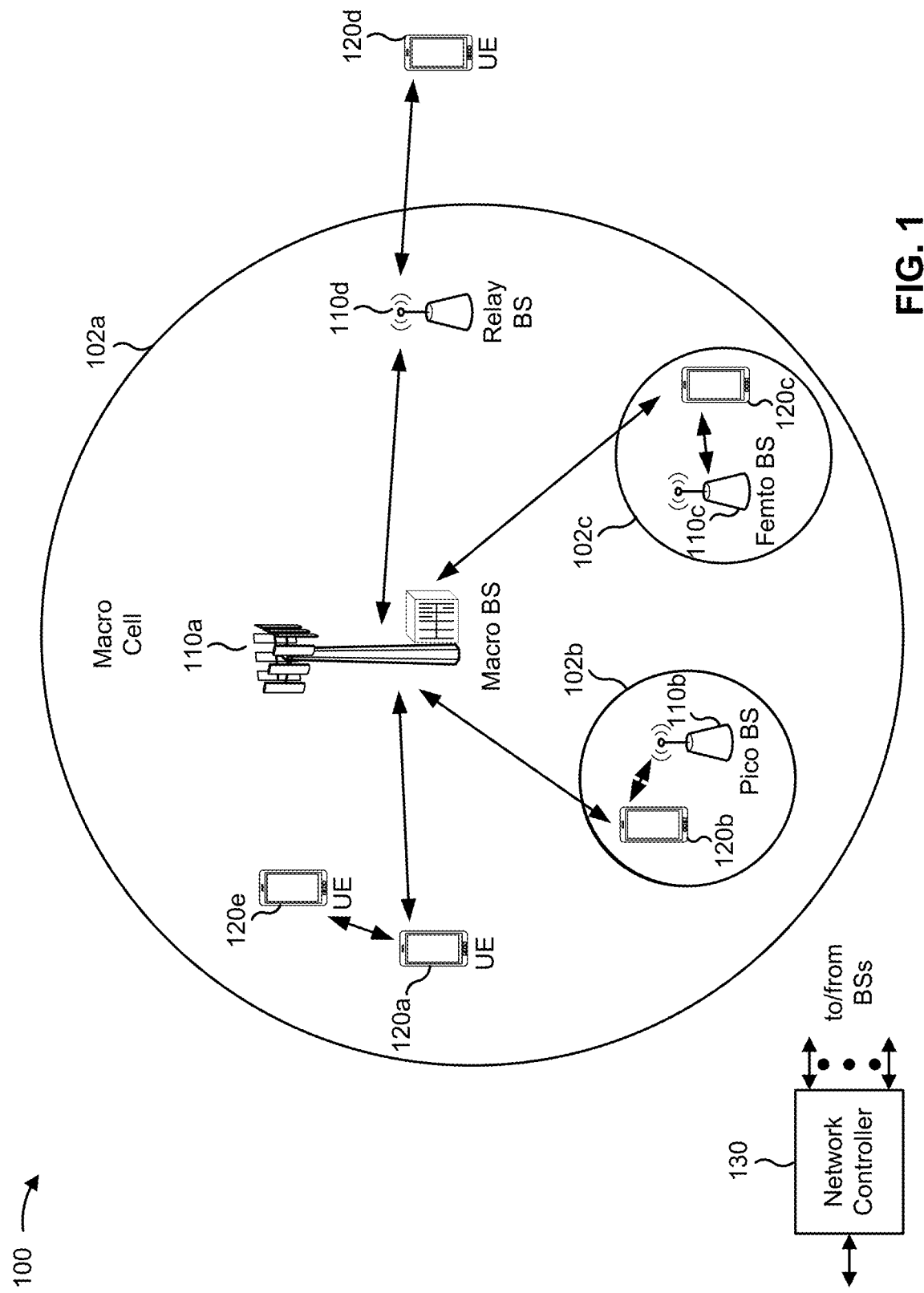
FIG. 1 is a block diagram conceptually illustrating an example of a wireless communication network, in accordance with various aspects of the present disclosure.

FIG. 1 is a diagram illustrating a network 100 in which aspects of the present disclosure may be practiced. The network 100 may be an LTE network or some other wireless network, such as a 5G or NR network. Wireless network 100 may include a number of BSs 110 (shown as BS 110a, BS 110b, BS 110c, and BS 110d) and other network entities. A BS is an entity that communicates with user equipment (UEs) and may also be referred to as a base station, a NR BS, a Node B, a gNB, a 5G node B (NB), an access point, a transmit receive point (TRP), and/or the like. Each BS may provide communication coverage for a particular geographic area. In 3GPP, the term "cell" can refer to a coverage area of a BS and/or a BS subsystem serving this coverage area, depending on the context in which the term is used.

A BS may provide communication coverage for a macro cell, a pico cell, a femto cell, and/or another type of cell. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having association with the femto cell (e.g., UEs in a closed subscriber group (CSG)). ABS for a macro cell may be referred to as a macro BS. ABS for a pico cell may be referred to as a pico BS. A BS for a femto cell may be referred to as a femto BS or a home BS. In the example shown in FIG. 1, a BS 110a may be a macro BS for a macro cell 102a, a BS 110b may be a pico BS for a pico cell 102b, and a BS 110c may be a femto BS for a femto cell 102c. ABS may support one or multiple (e.g., three) cells. The terms "eNB", "base station", "NR BS", "gNB", "TRP", "AP", "node B", "5G NB", and "cell" may be used interchangeably herein.

In some aspects, a cell may not necessarily be stationary, and the geographic area of the cell may move according to the location of a mobile BS. In some aspects, the BSs may be interconnected to one another and/or to one or more other BSs or network nodes (not shown) in the access network 100 through various types of backhaul interfaces such as a direct physical connection, a virtual network, and/or the like using any suitable transport network.

Wireless network 100 may also include relay stations. A relay station is an entity that can receive a transmission of data from an upstream station (e.g., a BS or a UE) and send a transmission of the data to a downstream station (e.g., a UE or a BS). A relay station may also be a UE that can relay transmissions for other UEs. In the example shown in FIG. 1, a relay station 110d may communicate with macro BS 110a and a UE 120d in order to facilitate communication between BS 110a and UE 120d. A relay station may also be referred to as a relay BS, a relay base station, a relay, and/or the like.

Wireless network 100 may be a heterogeneous network that includes BSs of different types, e.g., macro BSs, pico BSs, femto BSs, relay BSs, and/or the like. These different types of BSs may have different transmit power levels, different coverage areas, and different impact on interference in wireless network 100. For example, macro BSs may have a high transmit power level (e.g., 5 to 40 Watts) whereas pico BSs, femto BSs, and relay BSs may have lower transmit power levels (e.g., 0.1 to 2 Watts).

A network controller 130 may couple to a set of BSs and may provide coordination and control for these BSs. Network controller 130 may communicate with the BSs via a backhaul. The BSs may also communicate with one another, e.g., directly or indirectly via a wireless or wireline backhaul.

UEs 120 (e.g., 120a, 120b, 120c) may be dispersed throughout wireless network 100, and each UE may be stationary or mobile. A UE may also be referred to as an access terminal, a terminal, a mobile station, a subscriber unit, a station, and/or the like. A UE may be a cellular phone (e.g., a smart phone), a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, medical device or equipment, biometric sensors/devices, wearable devices (smart watches, smart clothing, smart glasses, smart wrist bands, smart jewelry (e.g., smart ring, smart bracelet)), an entertainment device (e.g., a music or video device, or a satellite radio), a vehicular component or sensor, smart meters/sensors, industrial manufacturing equipment, a global positioning system device, or any other suitable device that is configured to communicate via a wireless or wired medium.

Some UEs may be considered machine-type communication (MTC) or evolved or enhanced machine-type communication (eMTC) UEs. MTC and eMTC UEs include, for example, robots, drones, remote devices, such as sensors, meters, monitors, location tags, and/or the like, that may communicate with a base station, another device (e.g., remote device), or some other entity. A wireless node may provide, for example, connectivity for or to a network (e.g., a wide area network such as Internet or a cellular network) via a wired or wireless communication link. Some UEs may be considered Internet-of-Things (IoT) devices, and/or may be implemented as NB-IoT (narrowband internet of things) devices. Some UEs may be considered a Customer Premises Equipment (CPE). UE 120 may be included inside a housing that houses components of UE 120, such as processor components, memory components, and/or the like.

In general, any number of wireless networks may be deployed in a given geographic area. Each wireless network may support a particular RAT and may operate on one or more frequencies. A RAT may also be referred to as a radio technology, an air interface, and/or the like. A frequency may also be referred to as a carrier, a frequency channel, and/or the like. Each frequency may support a single RAT in a given geographic area in order to avoid interference between wireless networks of different RATs. In some cases, NR or 5G RAT networks may be deployed.

In some aspects, two or more UEs 120 (e.g., shown as UE 120a and UE 120e) may communicate directly using one or more sidelink channels (e.g., without using a base station 110 as an intermediary to communicate with one another). For example, the UEs 120 may communicate using peer-to-peer (P2P) communications, device-to-device (D2D) communications, a vehicle-to-everything (V2X) protocol (e.g., which may include a vehicle-to-vehicle (V2V) protocol, a vehicle-to-infrastructure (V2I) protocol, and/or the like), a mesh network, and/or the like. In this case, the UE 120 may perform scheduling operations, resource selection operations, and/or other operations described elsewhere herein as being performed by the base station 110.

As indicated above, FIG. 1 is provided merely as an example. Other examples may differ from what was described with regard to FIG. 1.

Figure 2:
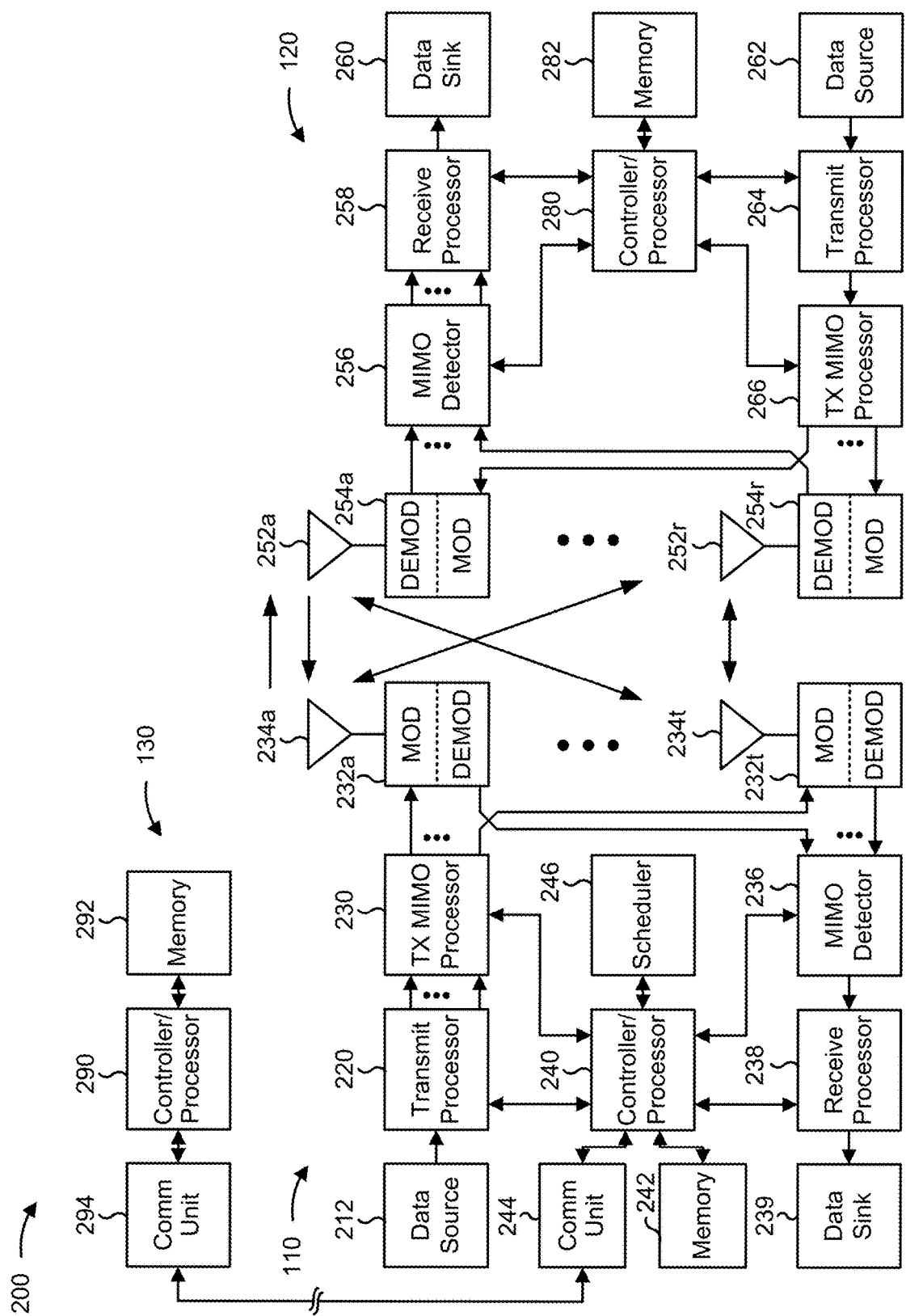
FIG. 2 is a block diagram conceptually illustrating an example of a base station in communication with a UE in a wireless communication network, in accordance with various aspects of the present disclosure.

FIG. 2 shows a block diagram of a design 200 of base station 110 and UE 120, which may be one of the base stations and one of the UEs in FIG. 1. Base station 110 may be equipped with T antennas 234a through 234t, and UE 120 may be equipped with R antennas 252a through 252r, where in general T≥1 and R≥1.

At base station 110, a transmit processor 220 may receive data from a data source 212 for one or more UEs, select one or more modulation and coding schemes (MCS) for each UE based at least in part on channel quality indicators (CQIs) received from the UE, process (e.g., encode and modulate) the data for each UE based at least in part on the MCS(s) selected for the UE, and provide data symbols for all UEs. Transmit processor 220 may also process system information (e.g., for semi-static resource partitioning information (SRPI) and/or the like) and control information (e.g., CQI requests, grants, upper layer signaling, and/or the like) and provide overhead symbols and control symbols. Transmit processor 220 may also generate reference symbols for reference signals (e.g., the cell-specific reference signal (CRS)) and synchronization signals (e.g., the primary synchronization signal (PSS) and secondary synchronization signal (SSS)). A transmit (TX) multiple-input multiple-output (MIMO) processor 230 may perform spatial processing (e.g., precoding) on the data symbols, the control symbols, the overhead symbols, and/or the reference symbols, if applicable, and may provide T output symbol streams to T modulators (MODs) 232a through 232t. Each modulator 232 may process a respective output symbol stream (e.g., for OFDM and/or the like) to obtain an output sample stream. Each modulator 232 may further process (e.g., convert to analog, amplify, filter, and upconvert) the output sample stream to obtain a downlink signal. T downlink signals from modulators 232a through 232t may be transmitted via T antennas 234a through 234t, respectively. According to various aspects described in more detail below, the synchronization signals can be generated with location encoding to convey additional information.

At UE 120, antennas 252a through 252r may receive the downlink signals from base station 110 and/or other base stations and may provide received signals to demodulators (DEMODs) 254a through 254r, respectively. Each demodulator 254 may condition (e.g., filter, amplify, downconvert, and digitize) a received signal to obtain input samples. Each demodulator 254 may further process the input samples (e.g., for OFDM and/or the like) to obtain received symbols. A MIMO detector 256 may obtain received symbols from all R demodulators 254a through 254r, perform MIMO detection on the received symbols if applicable, and provide detected symbols. A receive processor 258 may process (e.g., demodulate and decode) the detected symbols, provide decoded data for UE 120 to a data sink 260, and provide decoded control information and system information to a controller/processor 280. A channel processor may determine reference signal received power (RSRP), received signal strength indicator (RSSI), reference signal received quality (RSRQ), channel quality indicator (CQI), and/or the like. In some aspects, one or more components of UE 120 may be included in a housing.

On the uplink, at UE 120, a transmit processor 264 may receive and process data from a data source 262 and control information (e.g., for reports comprising RSRP, RSSI, RSRQ, CQI, and/or the like) from controller/processor 280. Transmit processor 264 may also generate reference symbols for one or more reference signals. The symbols from transmit processor 264 may be precoded by a TX MIMO processor 266 if applicable, further processed by modulators 254a through 254r (e.g., for DFT-s-OFDM, CP-OFDM, and/or the like), and transmitted to base station 110. At base station 110, the uplink signals from UE 120 and other UEs may be received by antennas 234, processed by demodulators 232, detected by a MIMO detector 236 if applicable, and further processed by a receive processor 238 to obtain decoded data and control information sent by UE 120. Receive processor 238 may provide the decoded data to a data sink 239 and the decoded control information to controller/processor 240. Base station 110 may include communication unit 244 and communicate to network controller 130 via communication unit 244. Network controller 130 may include communication unit 294, controller/processor 290, and memory 292.

Controller/processor 240 of base station 110, controller/processor 280 of UE 120, and/or any other component(s) of FIG. 2 may perform one or more techniques associated with using a pre-emption indication associated with a quasi co-location (QCL) relationship and/or a transmission configuration indicator (TCI) state, as described in more detail elsewhere herein. For example, controller/processor 240 of base station 110, controller/processor 280 of UE 120, and/or any other component(s) of FIG. 2 may perform or direct operations of, for example, process 700 of FIG. 7, process 800 of FIG. 8, and/or other processes as described herein. Memories 242 and 282 may store data and program codes for base station 110 and UE 120, respectively. A scheduler 246 may schedule UEs for data transmission on the downlink and/or uplink.

In some aspects, UE 120 may include means for receiving a configuration that indicates an association between a pre-emption indication field and at least one of: a set of TCI states, a set of DMRS ports, or a set of layers; means for receiving DCI that includes a pre-emption indication that is indicated as a set of bits in the pre-emption indication field; means for determining whether the UE 120 is scheduled to receive a communication in one or more pre-empted resources indicated by the set of bits, via a component carrier associated with the pre-emption indication, and using at least one of: a TCI state included in the set of TCI states, a DMRS port included in the set of DMRS ports, or a layer included in the set of layers; means for decoding the communication based at least in part on the determination; and/or the like. In some aspects, such means may include one or more components of UE 120 described in connection with FIG. 2.

In some aspects, base station 110 may include means for transmitting a configuration that indicates an association between a pre-emption indication field and at least one of a set of TCI states, a set of DMRS ports, or a set of layers; means for determining that a scheduled communication, associated with at least one of a TCI state of the set of TCI states, a DMRS port of the set of DMRS ports, or a layer of the set of layers, is pre-empted for a UE; means for transmitting downlink control information (DCI) that includes a pre-emption indication, that is indicated as a set of bits in the pre-emption indication field, based at least in part on the determination, wherein the pre-emption indication indicates one or more pre-empted resources in which the scheduled communication is pre-empted for the UE; and/or the like. In some aspects, such means may include one or more components of base station 110 described in connection with FIG. 2.

As indicated above, FIG. 2 is provided merely as an example. Other examples may differ from what was described with regard to FIG. 2.

Figure 3:
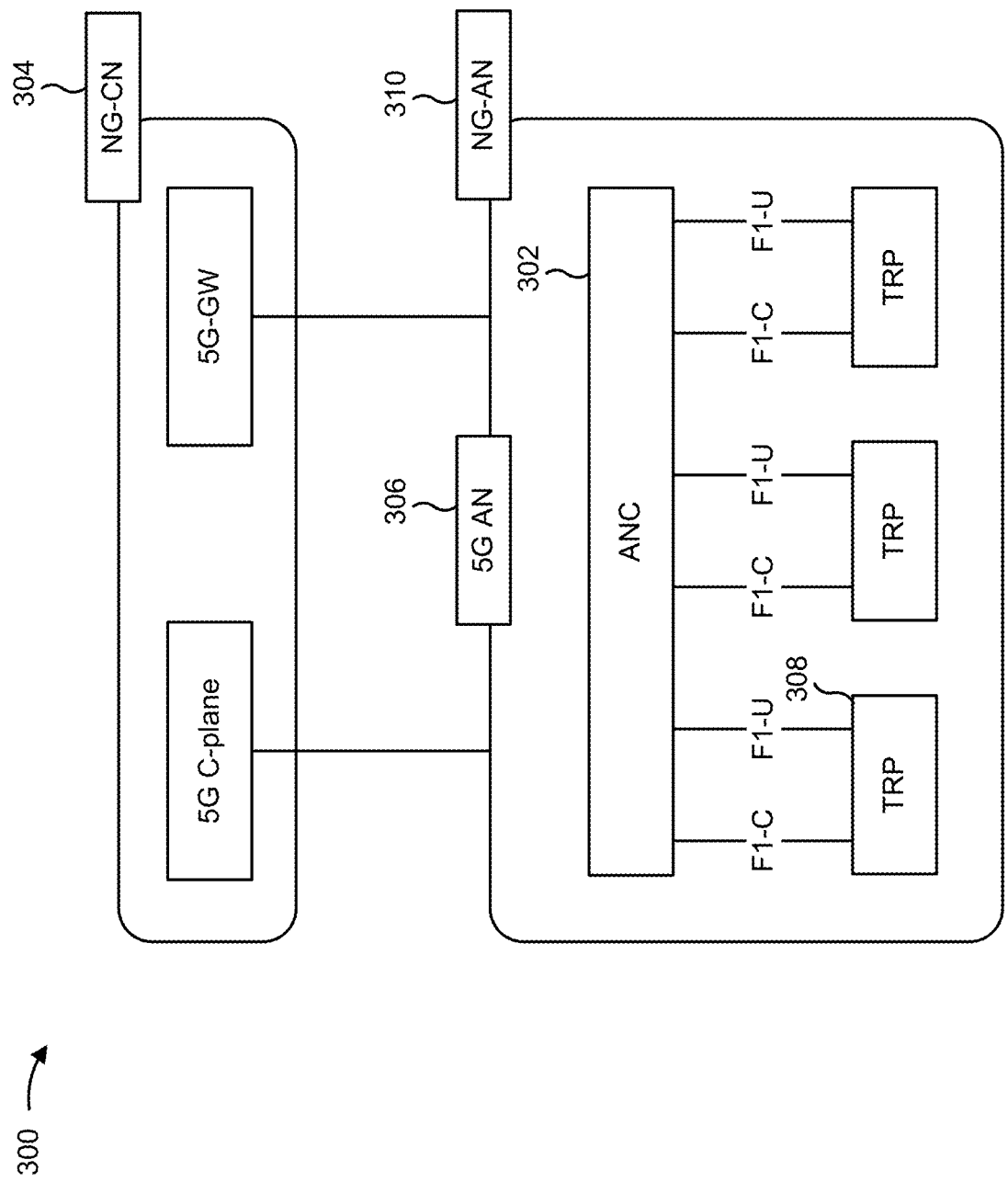
FIG. 3 illustrates an example logical architecture of a distributed radio access network (RAN), in accordance with various aspects of the present disclosure.

FIG. 3 illustrates an example logical architecture of a distributed RAN 300, according to aspects of the present disclosure.

A 5G access node 306 may include an access node controller (ANC) 302. The ANC 302 may be a central unit (CU) of the distributed RAN 300. The backhaul interface to the next generation core network (NG-CN) 304 may terminate at the ANC 302. The backhaul interface to neighboring next generation access nodes (NG-ANs) may terminate at the ANC 302. The ANC 302 may include one or more TRPs 308 (which may also be referred to as BSs, NR BSs, Node Bs, 5G NBs, APs, gNB, or some other term). A TRP 308 may be used interchangeably with "cell" and/or "panel." In some aspects, multiple TRPs 308 may be included in a single base station 110. Additionally, or alternatively, different TRPs 308 may be included in different base stations 110.

A TRP 308 may be a distributed unit (DU). A TRP 308 may be connected to a single ANC 302 or multiple ANCs 302. For example, for RAN sharing, radio as a service (RaaS), and service specific AND deployments, the TRP 308 may be connected to more than one ANC 302. A TRP 308 may include one or more antenna ports. The TRPs 308 may be configured to individually (e.g., using dynamic selection) or jointly (e.g., using joint transmission) serve traffic to a UE 120.

In some aspects, multiple TRPs 308 may transmit communications (e.g., the same communication or different communications) in the same TTI or different TTIs (e.g., slots, mini-slots, and/or the like) using different QCL relationships (e.g., different spatial parameters, different transmission configuration indicator (TCI) states, different precoding parameters, different beamforming parameters, and/or the like). In some aspects, a TCI state may be used to indicate one or more QCL relationships.

The local architecture of RAN 300 may be used to illustrate fronthaul definition. The architecture may be defined to support fronthauling solutions across different deployment types. For example, the architecture may be based at least in part on transmit network capabilities (e.g., bandwidth, latency, and/or jitter). The architecture may share features and/or components with LTE. According to aspects, the next generation AN (NG-AN) 310 may support dual connectivity with NR. The NG-AN 310 may share a common fronthaul for LTE and NR. The architecture may enable cooperation between and among TRPs 308. For example, cooperation may be preset within a TRP 308 and/or across TRPs 308 via the ANC 302. In some aspects, no inter-TRP interface may be needed/present.

In some aspects, a dynamic configuration of split logical functions may be present within the architecture of RAN 300. The packet data convergence protocol (PDCP), radio link control (RLC), media access control (MAC) protocol, and/or the like may be adaptably placed at the ANC 302 or TRP 308. According to various aspects, a base station 110 may include a central unit (CU) (e.g., ANC 302) and/or one or more distributed units (e.g., one or more TRPs 308).

As indicated above, FIG. 3 is provided merely as an example. Other examples may differ from what was described with regard to FIG. 3.

Figure 4:
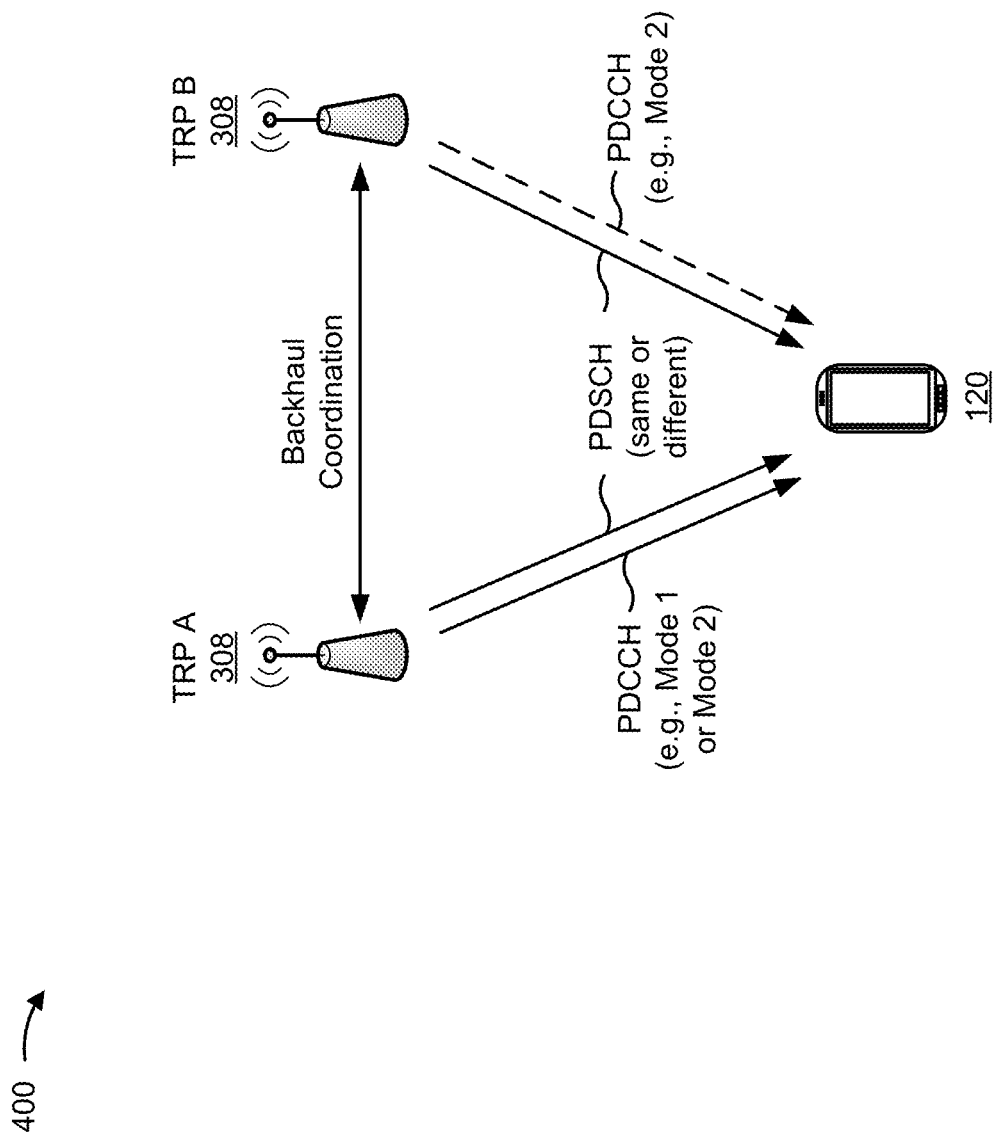
FIG. 4 is a diagram illustrating an example of multi-TRP communication, in accordance with various aspects of the present disclosure.

FIG. 4 is a diagram illustrating an example 400 of multi-TRP communication (sometimes referred to as multi-panel communication), in accordance with various aspects of the present disclosure.

As shown in FIG. 4, multiple TRPs 308 (shown as TRP A and TRP B) may communicate with the same UE 120 in a coordinated manner (e.g., using coordinated multipoint transmissions and/or the like) to improve reliability, increase throughput, and/or the like. The TRPs 308 may coordinate such communications via a backhaul, which may have a smaller delay and/or higher capacity when the TRPs 308 are co-located at the same base station 110 (e.g., different antenna arrays of the same base station 110), or may have a larger delay and/or lower capacity (as compared to co-location) when the TRPs 308 are located at different base stations 110. The different TRPs 308 may communicate with the UE 120 using different QCL relationships (e.g., different TCI states), different demodulation reference signal (DMRS) ports, different layers (e.g., of a multi-layer communication), and/or the like.

In a first multi-TRP transmission mode (e.g., Mode 1), a single physical downlink control channel (PDCCH) may be used to schedule downlink data communications for a single physical downlink shared channel (PDSCH). In this case, multiple TRPs 308 (e.g., TRP A and TRP B) may transmit communications to the UE 120 on the same PDSCH. For example, a communication may be transmitted using a single codeword with different spatial layers for different TRPs 308 (e.g., where one codeword maps to a first set of layers transmitted by a first TRP 308 and maps to a second set of layers transmitted by a second TRP 308). As another example, a communication may be transmitted using multiple codewords, where different codewords are transmitted by different TRPs 308 (e.g., using different sets of layers). In either case, different TRPs 308 may use different QCL relationships (e.g., different TCI states) for different DMRS ports corresponding to different layers. For example, a first TRP 308 may use a first QCL relationship or a first TCI state for a first set of DMRS ports corresponding to a first set of layers, and a second TRP 308 may use a second (different) QCL relationship or a second (different) TCI state for a second (different) set of DMRS ports corresponding to a second (different) set of layers. In some aspects, a TCI state in downlink control information (DCI) (e.g., transmitted on the PDCCH, such as DCI format 1_0, DCI format 1_1, and/or the like) may indicate the first QCL relationship (e.g., by indicating a first TCI state) and the second QCL relationship (e.g., by indicating a second TCI state). The first and the second TCI states may be indicated using a TCI field in the DCI. In general, the TCI field can indicate a single TCI state (for single-TRP transmission) or multiple TCI states (for multi-TRP transmission as discussed here) in this multi-TRP transmission mode (e.g., Mode 1).

In a second multi-TRP transmission mode (e.g., Mode 2), multiple PDCCHs may be used to schedule downlink data communications for multiple corresponding PDSCHs (e.g., one PDCCH for each PDSCH). In this case, a first PDCCH may schedule a first codeword to be transmitted by a first TRP 308, and a second PDCCH may schedule a second codeword to be transmitted by a second TRP 308. Furthermore, first DCI (e.g., transmitted by the first TRP 308) may schedule a first PDSCH communication associated with a first set of DMRS ports with a first QCL relationship (e.g., indicated by a first TCI state) for the first TRP 308, and second DCI (e.g., transmitted by the second TRP 308) may schedule a second PDSCH communication associated with a second set of DMRS ports with a second QCL relationship (e.g., indicated by a second TCI state) for the second TRP 308. In this case, DCI (e.g., having DCI format 1_0, DCI format 1_1, and/or the like) may indicate a corresponding TCI state for a TRP 308 corresponding to the DCI. The TCI field of a DCI indicates the corresponding TCI state (e.g., the TCI field of the first DCI indicates the first TCI state and the TCI field of the second DCI indicates the second TCI state).

In some cases, a group-common DCI (e.g., having DCI format 2_1) may be used to transmit a set of pre-emption indications (e.g., in a corresponding set of pre-emption indication fields). A pre-emption indication (e.g., a downlink pre-emption indication) may be used to indicate, to a UE 120, one or more resources (e.g., one or more time resources, one or more frequency resources, one or more physical resource blocks (PRBs), one or more OFDM symbols, and/or the like) for which the UE 120 may assume that no transmission is intended for the UE 120. For example, a pre-emption indication may include 14 bits, which may map to 14 sets of symbols. For example, each bit may map to a single symbol. Alternatively, each bit may map to more than one symbol (e.g., two symbols, four symbols, and/or the like). In some aspects, a manner in which the bits map to symbols and a time period (e.g., one or more slots) that correspond to the symbols may be configured for a UE 120 in a radio resource control (RRC) message (e.g., an RRC configuration message, an RRC reconfiguration message, and/or the like). In some aspects, the bits of a pre-emption indication may correspond to symbols in one or more slots (e.g., a single slot, two slots, and/or the like) that precede a slot in which the group-common DCI is received.

For example, a base station 110 may schedule a communication (e.g., a data communication, a PDSCH communication, and/or the like) for a first UE 120 in a set of resources. At a later time, the base station 110 may reschedule one or more resources, of the set of resources, for a different communication, such as an ultra-reliable low-latency communication (URLLC) for a second UE 120, a higher priority communication than the communication scheduled for the first UE 120, and/or the like. In this case, to avoid or reduce decoding errors, the base station 110 may indicate, to the first UE 120, that the one or more resources have been pre-empted (also referred to as puncturing the one or more resources). The base station 110 may transmit this indication using a pre-emption indication included in DCI (e.g., DCI format 2_1), which may be referred to as pre-emption DCI, group-common DCI, and/or the like.

In some aspects, the DCI that includes pre-emption indication(s) may be scrambled using an interruption radio network temporary identifier (INT-RNTI) (e.g., used to scramble the cyclic redundancy check (CRC) bits of the DCI). A group of UEs 120 may be configured with the INT-RNTI, and may use the INT-RNTI to search for group-common DCI intended for the group of UEs 120. In some aspects, different UEs 120 in the group of UEs 120 may be configured (e.g., via RRC configuration) with different interpretations of the group-common DCI. For example, a specific pre-emption indication may apply to a first component carrier (e.g., a first serving cell) for a first UE 120, and may apply to a second component carrier (e.g., a second serving cell) for a second UE 120. Additionally, or alternatively, different UEs 120 may be configured to use different pre-emption indications (e.g., in different pre-emption indication fields of the group-common DCI).

However, when the UE 120 communicates in a multi-TRP transmission mode, a first TRP 308 may pre-empt a portion of the PDSCH, while a second TRP 308 may not pre-empt that portion of the PDSCH. Furthermore, different TRPs 308 may pre-empt different portions of the PDSCH, or may pre-empt the same portion of the PDSCH (e.g., on different layers). When a pre-emption indication is transmitted in a multi-TRP transmission mode, and the UE 120 treats the pre-emption indication as indicating pre-emption of communications of multiple TRPs 308, then network resources and resources of base station 110 and UE 120 (e.g., memory resources, processing resources, battery power, and/or the like) may be wasted by transmitting communications that are discarded by the UE 120. Some techniques and apparatuses described herein permit TRP-specific pre-emption indications, thereby conserving network resources, resources of base station 110 (e.g., TRPs 308), and resources of UEs 120. Additional details are described below.

As indicated above, FIG. 4 is provided as an example. Other examples may differ from what is described with respect to FIG. 4.

Figure 5:
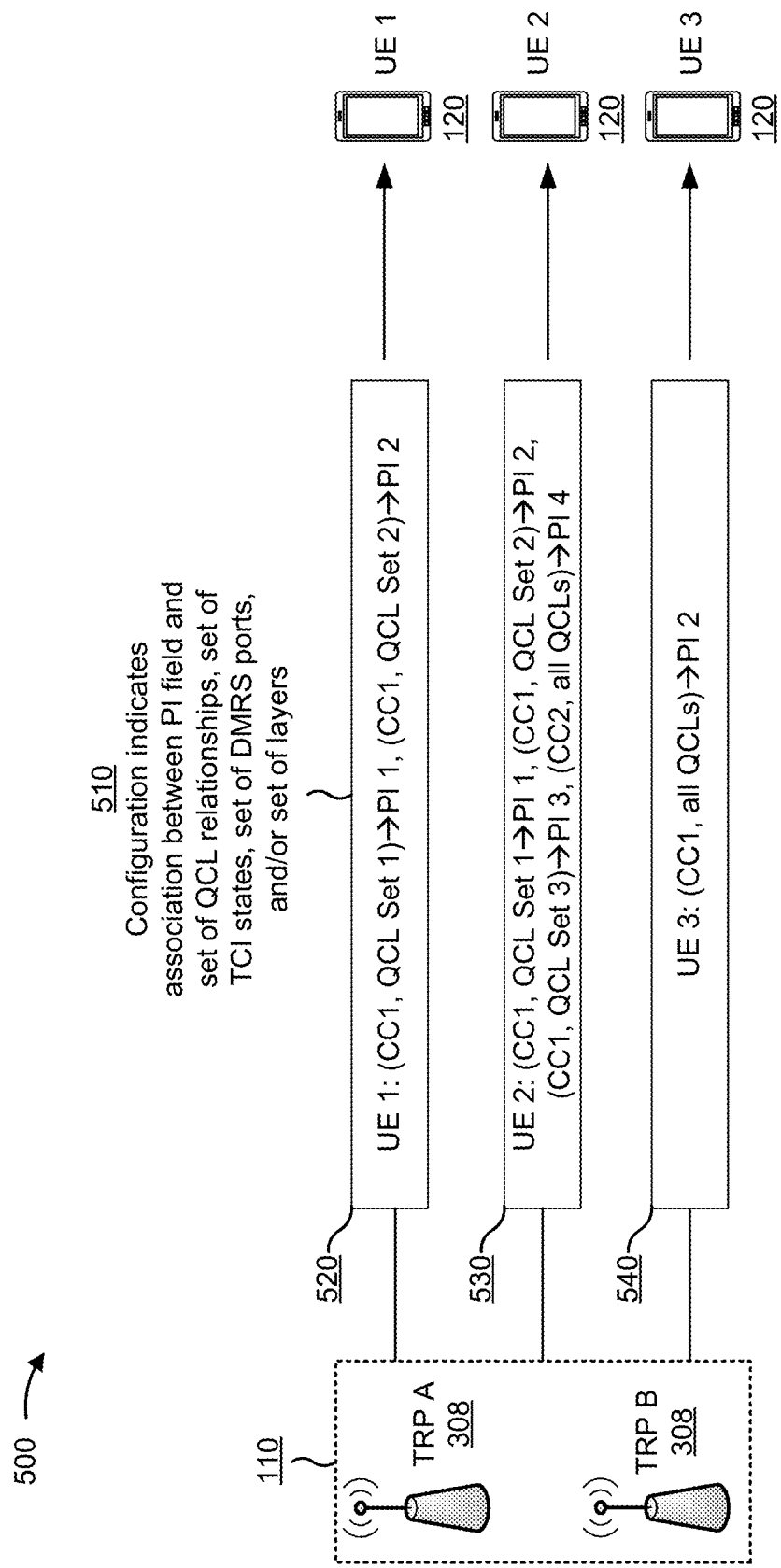
FIGS. 5 and 6 are diagrams illustrating examples of using a pre-emption indication associated with a quasi co-location relationship, in accordance with various aspects of the present disclosure.

FIG. 5 is a diagram illustrating an example 500 of using a pre-emption indication associated with a quasi co-location relationship, in accordance with various aspects of the present disclosure.

As shown in FIG. 5, multiple TRPs 308 (shown as TRP A and TRP B) may communicate with a UE 120, such as a first UE (shown as UE 1), a second UE (shown as UE 2), a third UE (shown as UE 3), and/or the like. In some aspects, the multiple TRPs 308 may be included in a single base station 110. In some aspects, different TRPs 308, of the multiple TRPs 308, may be included in different base stations 110. Although two TRPs 308 are shown as communicating with the UE 120, in some aspects, a different number of TRPs 308 (e.g., three TRPs 308, four TRPs 308, and/or the like) may communicate with the UE 120 in a multi-TRP mode, sometimes referred to as a multi-panel mode. Some operations are described herein as being performed by a base station 110. Such operations may be performed by a single TRP 308 included in the base station 110 or by multiple TRPs 308 included in the base station 110. As used herein, "TRP" may be used interchangeably with "panel."

As shown by reference number 510, the base station 110 may transmit, and a UE 120 may receive, a configuration that indicates an association between a pre-emption indication (PI) field and a set of quasi co-location (QCL) relationships, a set of TCI states, a set of demodulation reference signal (DMRS) ports, a set of layers, and/or the like. In some aspects, the configuration is indicated in an RRC message, such as an RRC configuration message, an RRC reconfiguration message, and/or the like. As such, in some aspects, the configuration may be UE-specific.

The pre-emption indication field may be included in DCI that is later transmitted to the UE 120, such as group-common DCI, pre-emption DCI, DCI having format 2_1, DCI scrambled with an INT-RNTI, and/or the like. Additional details regarding the DCI and the pre-emption indication field are described below in connection with FIG. 6.

In some aspects, the configuration may indicate a relationship between a pre-emption indication field and a set of QCL relationships, as shown in FIG. 5. Because a TCI state may be used to indicate one or more QCL relationships, in some aspects, the relationship between the pre-emption indication field and the set of QCL relationships may be indicated as a relationship between the pre-emption indication field and a set of TCI states. For example, and as shown by reference number 520, for a first UE (e.g., UE 1), a first pre-emption indication field (shown as PI 1) may be associated with a first set of QCL relationships (shown as QCL Set 1), and a second pre-emption indication field (shown as PI 2) may be associated with a second set of QCL relationships (shown as QCL Set 2). A set of QCL relationships may include one or more QCL relationships. In some aspects, a set of QCL relationships may include all QCL relationships (e.g., in the case of a single TRP mode). Similarly, a set of TCI states may include all TCI states. In some aspects, a set of QCL relationships or a set of TCI states may correspond to a single TRP 308 (e.g., a single panel). For example, the first set of QCL relationships (or the first set of TCI states) may correspond to TRP A, and the second set of QCL relationships (or the second set of TCI states) may correspond to TRP B. Additionally, or alternatively, the first set of QCL relationships (or the first set of TCI states) may be different from the second set of QCL relationships (or the second set of TCI states) (e.g., may be mutually exclusive, may include a different combination of QCL relationships or TCI states, and/or the like).

As further shown, a pre-emption indication field may also be associated with a component carrier (CC). In the example shown by reference number 520, the first pre-emption indication field is associated with a first component carrier (shown as CC1), and the second pre-emption indication field is also associated with the first component carrier. Thus, in some aspects, the first pre-emption indication field and the second pre-emption indication field may be associated with the same component carrier. However, in some aspects, the first pre-emption indication field and the second pre-emption indication field may be associated with different component carriers.

As further shown by reference numbers 520-540, the configurations may be UE-specific. For example, the configuration shown in association with reference number 520 is specific to UE 1. In example 500, UE 1 communicates using a single component carrier (e.g., CC1), and is capable of receiving PDSCH communications via the component carrier from a single TRP 308 or from multiple TRPs 308 simultaneously.

As shown by reference number 530, for a second UE (e.g., UE 2), the first pre-emption indication field (PI 1) may be associated with a first set of QCL relationships (QCL Set 1) for a first component carrier (CC1), the second pre-emption indication field (PI 2) may be associated with a second set of QCL relationships (QCL Set 2) for the first component carrier, a third pre-emption indication field (PI 3) may be associated with a third set of QCL relationships (QCL Set 3) for the first component carrier, and a fourth pre-emption indication field (PI 4) may be associated with all QCL relationships for a second component carrier. In some aspects, such a configuration may be used when UE 2 operates in a multi-TRP mode for the first component carrier, and operates in a single TRP mode for the second component carrier.

As shown by reference number 540, for a third UE (e.g., UE 3), the second pre-emption indication field (PI 2) may be associated with all QCL relationships or all TCI states for a first component carrier (CC1). In some aspects, such a configuration may be used when UE 3 operates in a single TRP mode.

Although FIG. 5 shows an example where the configuration indicates an association (e.g., a relationship) between a PI field and a set of QCL relationships (e.g., as indicated by a set of TCI states), in some aspects, the configuration may indicate a relationship between a set of TCI states, a set of DMRS ports, a set of layers, and/or the like, in a similar manner as described above. The set of DMRS ports may include one or more DMRS ports. In some aspects, the set of DMRS ports may be indicated using one or more DMRS port identifiers. Additionally, or alternatively, the set of DMRS ports may be indicated as a set of ports included in a code division multiplexing (CDM) group. Similarly, the set of layers may include one or more layers. In some aspects, the set of layers may be indicated using one or more layer identifiers.

Thus, as indicated above, different pre-emption indication fields, received in DCI, may be interpreted differently by different UEs 120 based at least in part on the configuration. For example, different UEs 120 may apply a pre-emption indication in a single PI field of DCI to different sets of QCL relationships, different CCs, different sets of DMRS ports, different layers, different TCI states, and/or the like. Additional details regarding the DCI are described below in connection with FIG. 6.

As indicated above, FIG. 5 is provided as an example. Other examples may differ from what is described with respect to FIG. 5.

Figure 6:
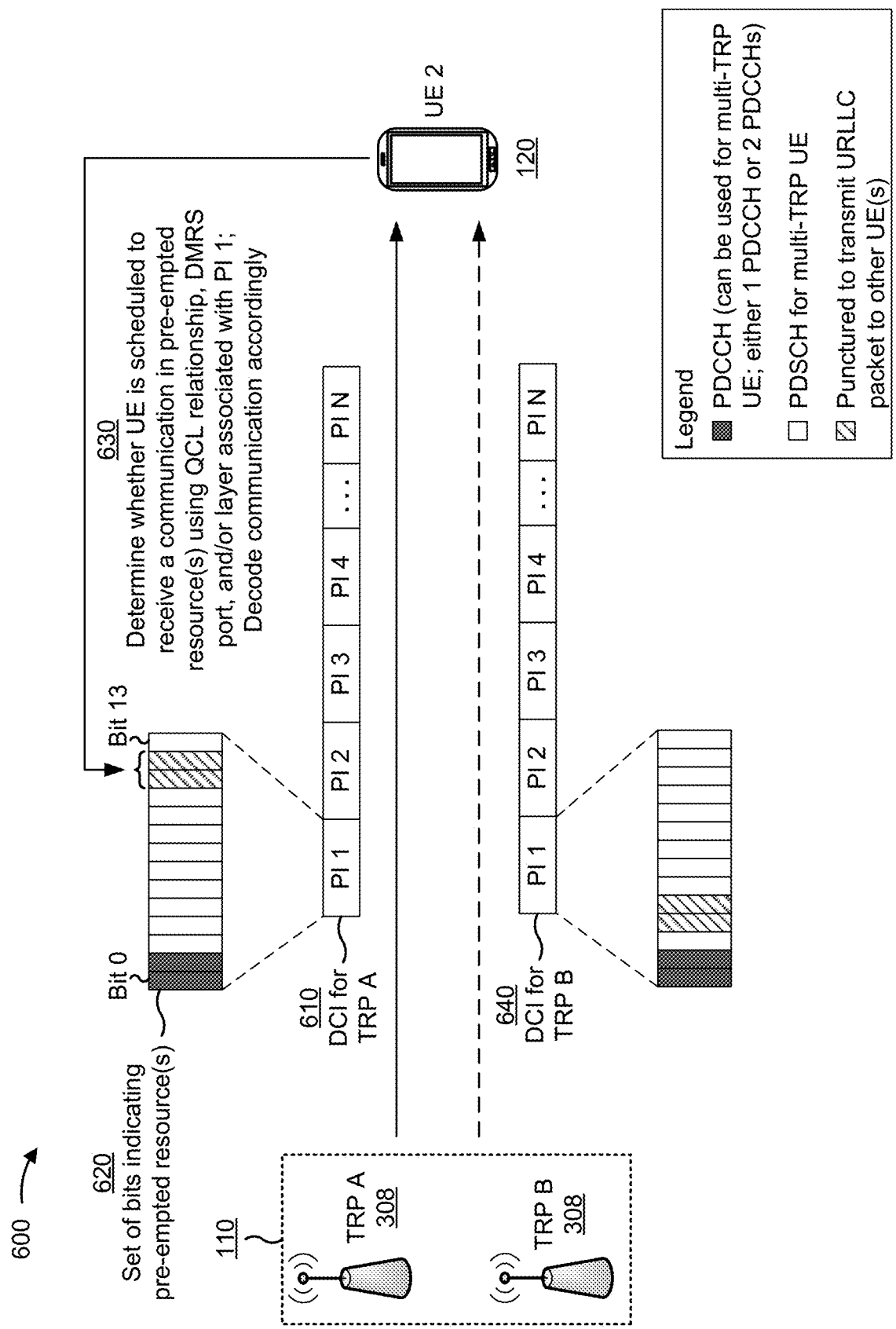

FIG. 6 is a diagram illustrating an example 600 of using a pre-emption indication associated with a quasi co-location relationship, in accordance with various aspects of the present disclosure. For the purposes of FIG. 6, it may be assumed that the operations described above in connection with FIG. 5 have already been performed.

As shown by reference number 610, the base station 110 (e.g., TRP A) may transmit, and a UE 120 (e.g., UE 2) may receive, DCI that includes a pre-emption indication. For example, the DCI may include group-common DCI, pre-emption DCI, DCI having format 2_1, DCI scrambled with an INT-RNTI, and/or the like. As shown, the DCI may include multiple pre-emption indications fields, shown as PI 1 through PI N (e.g., N>1). Each pre-emption indication field may include a pre-emption indication. Thus, a single pre-emption indication may be indicated as a set of bits in a single pre-emption indication field. In some aspects, a pre-emption indication field includes 14 bits, so a pre-emption indication may be 14 bits in length. In some aspects, a pre-emption indication field may include greater or fewer than 14 bits.

In some aspects, the base station 110 may transmit the DCI based at least in part on determining that a scheduled communication, scheduled for the UE 120, is pre-empted (e.g., in one or more resources). The base station 110 may determine a PI field, of the DCI, that corresponds to a QCL relationship (e.g., as indicated by a TCI state), a TCI state, a DMRS port, and/or a layer associated with the scheduled communication, and may transmit a pre-emption indication in the PI field.

As shown by reference number 620, the pre-emption indication may indicate one or more pre-empted resources (e.g., one or more PRBs and/or symbols that have been pre-empted and/or punctured, such as due to rescheduling of those resource(s) for a communication to a different UE 120). For example, a first value (e.g., zero) of a bit of the pre-emption indication may indicate that one or more resources, corresponding to the bit, have not been pre-empted (e.g., for communications associated with parameters indicated by PI 1, such as a QCL relationship, a TCI state, a CC, a DMRS port, a layer, and/or the like). Similarly, a second value (e.g., one) of a bit of the pre-emption indication may indicate that one or more resources, corresponding to the bit, have been pre-empted (e.g., for communications associated with parameters indicated by PI 1).

In example 600, the PI includes 14 bits, numbered from Bit 0 to Bit 13. As shown, Bit 11 and Bit 12 have values indicating that resources corresponding to Bit 11 and resources corresponding to Bit 12 have been pre-empted. For example, if Bits 0 through 13 correspond to 14 consecutive symbols (e.g., of a slot), the values of Bits 11 and 12 would indicate that the second-to-last symbol and the third-to-last symbol, of the 14 symbols, have been pre-empted. The DCI containing the PI may be transmitted after pre-emption has occurred. Thus, the DCI indicates pre-empted resources occurring in one or more prior slots. The time period covered by the DCI may correspond to a monitoring periodicity of the DCI. For example, if the UE 120 is configured to monitor for the DCI with PI every two slots, then the set of bits in the PI may cover the resources of two slots. In FIG. 6, the PDCCH shown in the first two symbols does not carry DCI indicating pre-emption, but rather is shown for the regular DCI that schedules downlink data communications.

As shown by reference number 630, the UE 120 may determine whether the UE 120 is scheduled to receive (and/or has received) a communication (e.g., a PDSCH communication) in one or more pre-empted resources indicated by the set of bits (e.g., of PI 1). Furthermore, the UE 120 may determine whether the communication is associated with one or more parameters configured for the pre-emption indication (e.g., PI 1) for the UE 120. The one or more parameters may be indicated in an RRC message, as described above in connection with FIG. 5. For example, the one or more parameters may include via a component carrier associated with the PI, a set of QCL relationships associated with the PI, a set of TCI states associated with the PI, a set of DMRS ports associated with the PI, a set of layers associated with the PI, and/or the like. Thus, the UE 120 may determine whether the communication is scheduled to be received (and/or has been received) via the component carrier associated with the PI. Additionally, or alternatively, the UE 120 may determine whether the communication is associated with a QCL relationship (e.g., a TCI state) of the set of QCL relationships (e.g., of the set of TCI states) associated with the PI, a DMRS port of the set of DMRS ports associated with the PI, a layer of the set of layers associated with the PI, and/or the like.

In some aspects, the UE 120 may determine whether the UE 120 has received a downlink grant that schedules a communication having the one or more parameters associated with the PI and that is scheduled in the one or more pre-empted resources.

The UE 120 may decode the communication based at least in part on one or more of the determinations described above. For example, the UE 120 may determine that the UE 120 has received a communication in the one or more pre-empted resources indicated by the set of bits in the PI, via a component carrier associated with the PI, and using at least one of a QCL relationship associated with the PI, a TCI state associated with the PI, a DMRS port associated with the PI, or a layer associated with the PI. The UE 120 may decode the communication based at least in part on this determination. For example, the UE 120 may discard stored information associated with the one or more pre-empted resources. For example, the UE 120 may reset one or more log likelihood ratio (LLR) values (e.g., stored in memory of the UE 120) corresponding to the one or more pre-empted resources.

In some aspects, the UE 120 may discard stored information (e.g., by resetting LLR values and/or the like) only for the QCL relationship, the TCI state, the DMRS port, and/or the layer associated with the PI. In this way, the UE 120 may retain stored information (e.g., LLR values) for other QCL relationships, TCI states, DMRS ports, and/or layers for which communications are not pre-empted, thereby improving decoding performance for those communications, conserving network resources (e.g., by reducing the likelihood that a retransmission will be needed for those communications), conserving UE resources and base station resources (e.g., that would otherwise be needed to process retransmissions), and/or the like. Furthermore, the UE 120 may improve decoding performance (e.g., a probability of successful decoding) for a communication (e.g., a pre-empted communication) by discarding received data that pre-empts a portion of the communication. In this case, the UE 120 may decode the communication using one or more non-pre-empted resources in which the communication is scheduled (e.g., one or more resources that are not indicated as pre-empted in PI), and without using the one or more pre-empted resources indicated by the PI. As indicated above, this may conserve network resources, UE resources, base station resources, and/or the like.

Alternatively, the UE 120 may discard stored information (e.g., by resetting LLR values and/or the like) for all QCL relationships, all TCI states (e.g., configured for the UE 120), all DMRS ports, and/or all layers (e.g., for all communications) in the one or more pre-empted resources. In this way, the base station 110 may reduce overhead of the DCI by using fewer bits to indicate pre-emption, by indicating pre-emption to a greater number of UEs 120 (e.g., using the same number or a smaller number of bits and/or DCI messages), and/or the like. In some aspects, the base station 110 may indicate, to a UE 120, whether the UE 120 is to discard stored information for only the QCL relationship, TCI state, DMRS port, and/or layer associated with the PI, or whether the UE 120 is to discard stored information for all QCL relationships, all TCI states, all DMRS ports, and/or all layers. This indication may be transmitted, for example, in an RRC message, in DCI (e.g., group-common DCI or other, UE-specific DCI), a media access control (MAC) control element (CE) (MAC-CE), and/or the like.

For example, referring to the configuration for UE 2 described above in connection with FIG. 5, because the pre-empted resources are indicated by PI 1, the UE 120 may determine whether a communication is scheduled for the UE 120 on CC1, using a QCL relationship include in QCL Set 1, and in the pre-empted resources indicated by the set of bits of PI 1 (e.g., resources corresponding to bits 11 and 12 of PI 1). If the UE 120 determines that such a communication is scheduled (e.g., that satisfies the above conditions associated with PI 1), then the UE 120 may reset LLRs corresponding to the pre-empted resources (e.g., for the QCL relationship or for all QCL relationships, as described above). Additionally, or alternatively, the UE 120 may exclude information received in the pre-empted resources when performing decoding of the communication. In this way, the UE 120 may improve decoding performance.

As shown by reference number 640, the base station 110 (e.g., TRP B) may transmit, and a UE 120 (e.g., UE 2) may receive, other DCI that includes a pre-emption indication. Thus, in some aspects, pre-emption DCI may include pre-emption indication(s) for only a single TRP 308 (or a single panel), and may exclude PIs for any other TRPs 308. For example, the base station 110 may transmit first pre-emption DCI for TRP A, and may transmit second pre-emption DCI for TRP B. In some aspects, the first pre-emption DCI may be transmitted by a first TRP 308 (e.g., TRP A), and the second pre-emption DCI may be transmitted by a second TRP 308 (e.g., TRP B). For example, in a second multi-TRP transmission mode (e.g., Mode 2), two PDCCHs may be used (e.g., one for each TRP 308), and each TRP 308 may transmit DCI on a corresponding PDCCH. In this case, TRP A may transmit first DCI on a first PDCCH corresponding to TRP A, and TRP B may transmit second DCI on a second PDCCH corresponding to TRP B. The first DCI may include only PI(s) for TRP A, and the second DCI may include only PI(s) for TRP B.

In some aspects, the base station 110 may transmit DCI that includes PIs for multiple TRPs 308 (e.g., multiple panels). For example, the base station 110 may transmit DCI that includes a first PI for TRP A, a second PI for TRP B, and/or the like. For example, in a first multi-TRP transmission mode (e.g., Mode 1), a single PDCCH may be used to schedule communications for multiple TRPs 308. In this case, DCI on the single PDCCH may include PIs for both a first TRP 308 and a second TRP 308.

By configuring PIs to be associated with a QCL relationship, a TCI state, a DMRS port, a layer, and/or the like, the base station 110 (e.g., TRPs 308) and/or the UE 120 may improve decoding performance (e.g., by avoiding processing of irrelevant information when decoding a pre-empted communication), may conserve network resources (e.g., by reducing the likelihood that a retransmission will be needed for pre-empted communications with degraded decoding performance due to processing of the irrelevant information), may conserve UE resources and base station resources (e.g., that would otherwise be used to process irrelevant information, to process retransmissions, and/or the like), and/or the like.

As indicated above, FIG. 6 is provided as an example. Other examples may differ from what is described with respect to FIG. 6.

Figure 7:
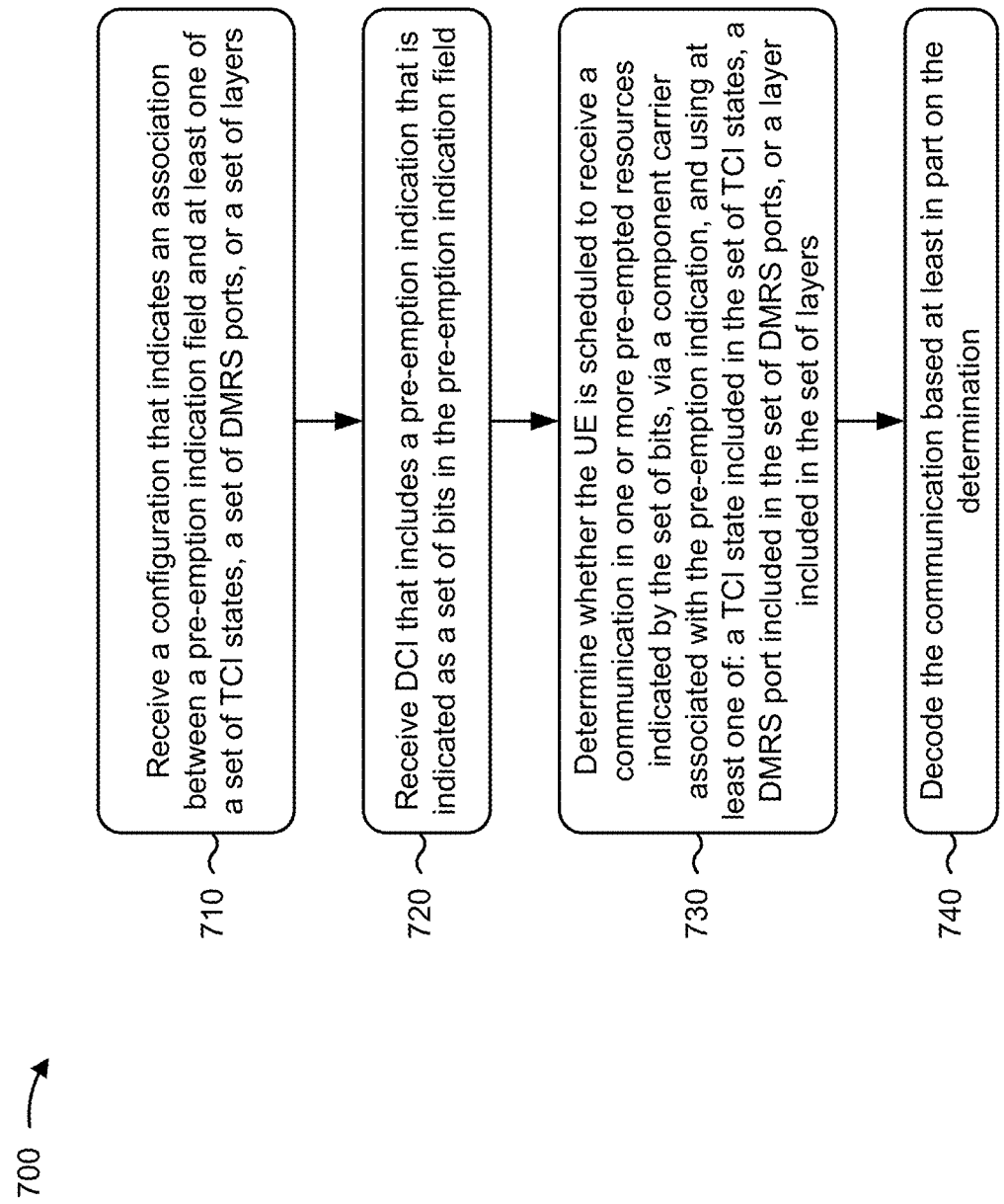
FIGS. 7 and 8 are diagrams illustrating example processes relating to using a pre-emption indication associated with a quasi co-location relationship, in accordance with various aspects of the present disclosure.

FIG. 7 is a diagram illustrating an example process 700 performed, for example, by a UE, in accordance with various aspects of the present disclosure. Example process 700 is an example where a UE (e.g., UE 120 and/or the like) performs operations associated with using a pre-emption indication associated with a QCL relationship.

As shown in FIG. 7, in some aspects, process 700 may include receiving a configuration that indicates an association between a pre-emption indication field and at least one of: a set of TCI states, a set of DMRS ports, or a set of layers (block 710). For example, the UE (e.g., using antenna 252, DEMOD 254, MIMO detector 256, receive processor 258, controller/processor 280, and/or the like) may receive a configuration that indicates an association between a pre-emption indication field and at least one of a set of TCI states, a set of DMRS ports, or a set of layers, as described above.

As further shown in FIG. 7, in some aspects, process 700 may include receiving DCI that includes a pre-emption indication that is indicated as a set of bits in the pre-emption indication field (block 720). For example, the UE (e.g., using antenna 252, DEMOD 254, MIMO detector 256, receive processor 258, controller/processor 280, and/or the like) may receive DCI that includes a pre-emption indication that is indicated as a set of bits in the pre-emption indication field, as described above.

As further shown in FIG. 7, in some aspects, process 700 may include determining whether the UE is scheduled to receive a communication in one or more pre-empted resources indicated by the set of bits, via a component carrier associated with the pre-emption indication, and using at least one of a TCI state included in the set of TCI states, a DMRS port included in the set of DMRS ports, or a layer included in the set of layers (block 730). For example, the UE (e.g., using controller/processor 280 and/or the like) may determine whether the UE is scheduled to receive a communication in one or more pre-empted resources indicated by the set of bits, via a component carrier associated with the pre-emption indication, and using at least one of a TCI state included in the set of TCI states, a DMRS port included in the set of DMRS ports, or a layer included in the set of layers, as described above.

As further shown in FIG. 7, in some aspects, process 700 may include decoding the communication based at least in part on the determination (block 740). For example, the UE (e.g., using controller/processor 280 and/or the like) may decode the communication based at least in part on the determination, as described above.

Process 700 may include additional aspects, such as any single aspect and/or any combination of aspects described below and/or in connection with one or more other processes described elsewhere herein.

In a first aspect, the configuration indicates an association between the pre-emption indication field and the set of TCI states.

In a second aspect, alone or in combination with the first aspect, the configuration indicates an association between the pre-emption indication field and the set of DMRS ports.

In a third aspect, alone or in combination with one or more of the first and second aspects, the configuration indicates an association between the pre-emption indication field and the set of layers.

In a fourth aspect, alone or in combination with one or more of the first through third aspects, the configuration is indicated in a radio resource control (RRC) message.

In a fifth aspect, alone or in combination with one or more of the first through fourth aspects, decoding the communication comprises resetting one or more log likelihood ratio (LLR) values corresponding to the one or more pre-empted resources based at least in part on a determination that the UE is scheduled to receive the communication the one or more pre-empted resources, via the component carrier, and using at least one of the TCI state, the DMRS port, or the layer.

In a sixth aspect, alone or in combination with one or more of the first through fifth aspects, the one or more LLR values correspond to at least one of the TCI state, the DMRS port, or the layer.

In a seventh aspect, alone or in combination with one or more of the first through sixth aspects, the one or more LLR values are reset for all TCI states, all DMRS ports, or all layers.

In an eighth aspect, alone or in combination with one or more of the first through seventh aspects, decoding the communication comprises decoding the communication using one or more non-pre-empted resources in which the communication is scheduled, and without using the one or more pre-empted resources, wherein the one or more non-pre-empted resources are indicated by the set of bits.

In a ninth aspect, alone or in combination with one or more of the first through eighth aspects, the set of TCI states includes all TCI states.

In a tenth aspect, alone or in combination with one or more of the first through ninth aspects, the set of TCI states corresponds to a single transmit receive point or a single panel in communication with the UE.

In an eleventh aspect, alone or in combination with one or more of the first through tenth aspects, the DCI includes one or more pre-emption indications, including the pre-emption indication, for multiple transmit receive points or multiple panels.

In a twelfth aspect, alone or in combination with one or more of the first through eleventh aspects, the DCI includes one or more pre-emption indications, including the pre-emption indication, for only a single transmit receive point (TRP) or a single panel.

In a thirteenth aspect, alone or in combination with one or more of the first through twelfth aspects, the UE is configured to receive the DCI from a first TRP or a first panel and is configured to receive other DCI from a second TRP or a second panel.

In a fourteenth aspect, alone or in combination with one or more of the first through thirteenth aspects, the set of TCI states corresponds to a set of quasi co-location (QCL) relationships.

Although FIG. 7 shows example blocks of process 700, in some aspects, process 700 may include additional blocks, fewer blocks, different blocks, or differently arranged blocks than those depicted in FIG. 7. Additionally, or alternatively, two or more of the blocks of process 700 may be performed in parallel.

Figure 8:
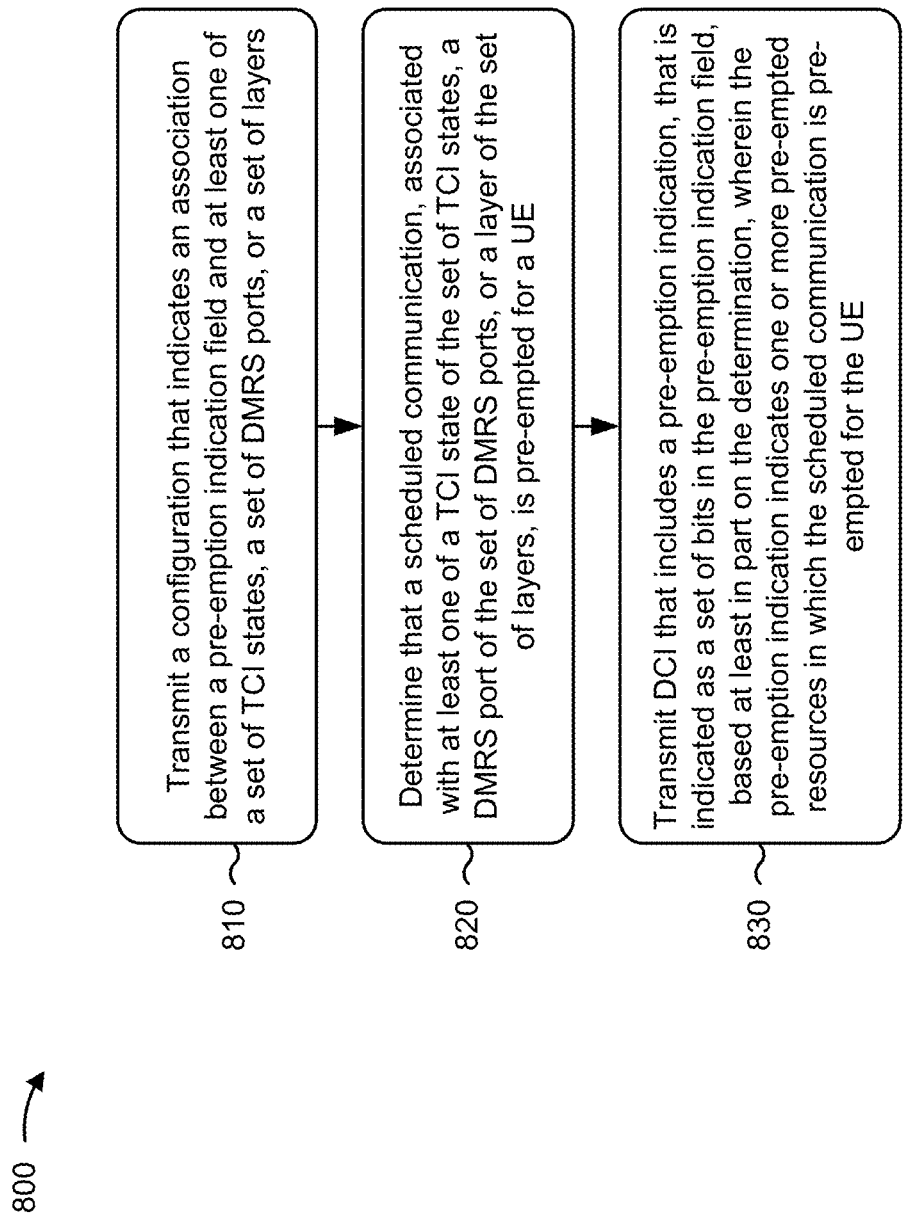

FIG. 8 is a diagram illustrating an example process 800 performed, for example, by a base station, in accordance with various aspects of the present disclosure. Example process 800 is an example where a base station (e.g., base station 110, TRP 308, and/or the like) performs operations associated with using a pre-emption indication associated with a QCL relationship.

As shown in FIG. 8, in some aspects, process 800 may include transmitting a configuration that indicates an association between a pre-emption indication field and at least one of a set of TCI states, a set of DMRS ports, or a set of layers (block 810). For example, the base station (e.g., using controller/processor 240, transmit processor 220, TX MIMO processor 230, MOD 232, antenna 234, and/or the like) may transmit a configuration that indicates an association between a pre-emption indication field and at least one of a set of TCI states, a set of DMRS ports, or a set of layers, as described above.

As further shown in FIG. 8, in some aspects, process 800 may include determining that a scheduled communication, associated with at least one of a TCI state of the set of TCI states, a DMRS port of the set of DMRS ports, or a layer of the set of layers, is pre-empted for a UE (block 820). For example, the base station (e.g., using controller/processor 240 and/or the like) may determine that a scheduled communication, associated with at least one of a TCI state of the set of TCI states, a DMRS port of the set of DMRS ports, or a layer of the set of layers, is pre-empted for a UE, as described above.

As further shown in FIG. 8, in some aspects, process 800 may include transmitting DCI that includes a pre-emption indication, that is indicated as a set of bits in the pre-emption indication field, based at least in part on the determination, wherein the pre-emption indication indicates one or more pre-empted resources in which the scheduled communication is pre-empted for the UE (block 830). For example, the base station (e.g., using controller/processor 240, transmit processor 220, TX MIMO processor 230, MOD 232, antenna 234, and/or the like) may transmit DCI that includes a pre-emption indication, that is indicated as a set of bits in the pre-emption indication field, based at least in part on the determination, as described above. In some aspects, the pre-emption indication indicates one or more pre-empted resources in which the scheduled communication is pre-empted for the UE.

Process 800 may include additional aspects, such as any single aspect and/or any combination of aspects described below and/or in connection with one or more other processes described elsewhere herein.

In a first aspect, the set of TCI states includes all TCI states.

In a second aspect, alone or in combination with the first aspect, the pre-emption indication is associated with a component carrier for which the scheduled communication is pre-empted.

In a third aspect, alone or in combination with one or more of the first and second aspects, the set of TCI states includes all TCI states for the one or more pre-empted resources and the component carrier.

In a fourth aspect, alone or in combination with one or more of the first through third aspects, the configuration indicates an association between the pre-emption indication field and the set of TCI states.

In a fifth aspect, alone or in combination with one or more of the first through fourth aspects, the configuration indicates an association between the pre-emption indication field and the set of DMRS ports.

In a sixth aspect, alone or in combination with one or more of the first through fifth aspects, the configuration indicates an association between the pre-emption indication field and the set of layers.

In a seventh aspect, alone or in combination with one or more of the first through sixth aspects, the configuration is indicated in a radio resource control (RRC) message.

In an eighth aspect, alone or in combination with one or more of the first through seventh aspects, the set of TCI states corresponds to a single transmit receive point or a single panel in communication with the UE.

In a ninth aspect, alone or in combination with one or more of the first through eighth aspects, the DCI includes one or more pre-emption indications, including the pre-emption indication, for multiple transmit receive points or multiple panels.

In a tenth aspect, alone or in combination with one or more of the first through ninth aspects, the DCI includes one or more pre-emption indications, including the pre-emption indication, for only a single transmit receive point or a single panel.

In an eleventh aspect, alone or in combination with one or more of the first through tenth aspects, the set of TCI states corresponds to a set of quasi co-location (QCL) relationships.

Although FIG. 8 shows example blocks of process 800, in some aspects, process 800 may include additional blocks, fewer blocks, different blocks, or differently arranged blocks than those depicted in FIG. 8. Additionally, or alternatively, two or more of the blocks of process 800 may be performed in parallel.

The foregoing disclosure provides illustration and description, but is not intended to be exhaustive or to limit the aspects to the precise form disclosed. Modifications and variations may be made in light of the above disclosure or may be acquired from practice of the aspects.

As used herein, the term "component" is intended to be broadly construed as hardware, firmware, and/or a combination of hardware and software. As used herein, a processor is implemented in hardware, firmware, and/or a combination of hardware and software.

Some aspects are described herein in connection with thresholds. As used herein, satisfying a threshold may refer to a value being greater than the threshold, greater than or equal to the threshold, less than the threshold, less than or equal to the threshold, equal to the threshold, not equal to the threshold, and/or the like.

It will be apparent that systems and/or methods, described herein, may be implemented in different forms of hardware, firmware, and/or a combination of hardware and software. The actual specialized control hardware or software code used to implement these systems and/or methods is not limiting of the aspects. Thus, the operation and behavior of the systems and/or methods were described herein without reference to specific software code—it being understood that software and hardware can be designed to implement the systems and/or methods based, at least in part, on the description herein.

Even though particular combinations of features are recited in the claims and/or disclosed in the specification, these combinations are not intended to limit the disclosure of various aspects. In fact, many of these features may be combined in ways not specifically recited in the claims and/or disclosed in the specification. Although each dependent claim listed below may directly depend on only one claim, the disclosure of various aspects includes each dependent claim in combination with every other claim in the claim set. A phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

No element, act, or instruction used herein should be construed as critical or essential unless explicitly described as such. Also, as used herein, the articles "a" and "an" are intended to include one or more items, and may be used interchangeably with "one or more." Furthermore, as used herein, the terms "set" and "group" are intended to include one or more items (e.g., related items, unrelated items, a combination of related and unrelated items, and/or the like), and may be used interchangeably with "one or more." Where only one item is intended, the phrase "only one" or similar language is used. Also, as used herein, the terms "has," "have," "having," and/or the like are intended to be open-ended terms. Further, the phrase "based on" is intended to mean "based, at least in part, on" unless explicitly stated otherwise.

What is claimed is:

1. A method of wireless communication performed by a user equipment (UE), comprising:
   receiving a configuration that indicates an association between pre-emption indication fields and sets of transmission configuration indicator (TCI) states,
   wherein a first pre-emption indication field and a second pre-emption indication field, of the pre-emption indication fields, correspond to a first set of TCI states and a second set of TCI states, of the sets of TCI states, respectively, and
   wherein the first pre-emption indication field is different from the second pre-emption indication field and the first set of TCI states is different from the second set of TCI states;
   receiving, based at least in part on receiving the configuration, downlink control information (DCI) that includes a pre-emption indication that is indicated as a set of bits in the first pre-emption indication field or the second pre-emption indication field, wherein each bit of the set of bits corresponds to a different symbol of a plurality of consecutive symbols;
   determining whether the UE is scheduled to receive a communication in one or more pre-empted resources indicated by the set of bits, via a component carrier associated with the first pre-emption indication field or the second pre-emption indication field, and using a TCI state included in the first set of TCI states or the second set of TCI states; and
   decoding the communication based at least in part on the determination.

2. The method of claim 1, wherein the configuration indicates an association between the pre-emption indication fields and a set of demodulation reference signal (DMRS) ports, and
   wherein a DMRS port included in the set of DMRS ports is used to determine whether the UE is scheduled to receive the communication.

3. The method of claim 1, wherein the configuration indicates an association between the pre-emption indication fields and a set of layers,
   wherein a layer included in the set of layers is used to determine whether the UE is scheduled to receive the communication.

4. The method of claim 1, wherein the configuration is indicated in a radio resource control (RRC) message.

5. The method of claim 1, wherein decoding the communication comprises resetting one or more log likelihood ratio (LLR) values corresponding to the one or more pre-empted resources based at least in part on a determination that the UE is scheduled to receive the communication in the one or more pre-empted resources, via the component carrier, and using the TCI state.

6. The method of claim 5, wherein the one or more LLR values correspond to the TCI state.

7. The method of claim 5, wherein the one or more LLR values are reset for all TCI states of the sets of TCI states.

8. The method of claim 1, wherein decoding the communication comprises decoding the communication using one or more non-pre-empted resources in which the communication is scheduled, and without using the one or more pre-empted resources.

9. The method of claim 1, wherein the sets of TCI states include all TCI states.

10. The method of claim 1, wherein the sets of TCI states correspond to a single transmit receive point (TRP) or a single panel in communication with the UE.

11. The method of claim 1, wherein the DCI includes one or more pre-emption indications, including the pre-emption indication, for multiple transmit receive points (TRPs) or multiple panels.

12. The method of claim 1, wherein the DCI includes one or more pre-emption indications, including the pre-emption indication, for only a single transmit receive point (TRP) or a single panel.

13. The method of claim 12, wherein the UE is configured to receive the DCI from a first TRP or a first panel and is configured to receive other DCI from a second TRP or a second panel.

14. The method of claim 1, wherein the sets of TCI states correspond to sets of quasi co-location (QCL) relationships.

15. The method of claim 1, wherein the first pre-emption indication field and the second pre-emption indication field are associated with the component carrier and a second component carrier, respectively.

16. A method of wireless communication performed by a network node, comprising:
    transmitting a configuration that indicates an association between pre-emption indication fields and sets of transmission configuration indicator (TCI) states,
        wherein a first pre-emption indication field and a second pre-emption indication field, of the pre-emption indication fields, correspond to a first set of TCI states and a second set of TCI states, of the sets of TCI states, respectively, and
        wherein the first pre-emption indication field is different from the second pre-emption indication field, and the first set of TCI states is different from the second set of TCI states;
    determining, based at least in part on the transmitting, that a scheduled communication, associated with a TCI state of the first set of TCI states or the second set of TCI states, is pre-empted for a user equipment (UE); and
    transmitting downlink control information (DCI) that includes a pre-emption indication, that is indicated as a set of bits in the first pre-emption indication field or the second pre-emption indication field, using a component carrier associated with the first pre-emption indication field or the second pre-emption indication field, based at least in part on the determination,
        wherein the pre-emption indication indicates one or more pre-empted resources in which the scheduled communication is pre-empted for the UE, and
        wherein each bit of the set of bits corresponds to a different symbol of a plurality of consecutive symbols.

17. The method of claim 16, wherein the sets of TCI states include all TCI states.

18. The method of claim 16, wherein the sets of TCI states include all TCI states for the component carrier.

19. The method of claim 16, wherein the configuration indicates an association between the pre-emption indication fields and a set of demodulation reference signal (DMRS) ports,
    wherein a DMRS port included in the set of DMRS ports is associated with the scheduled communication.

20. The method of claim 16, wherein the configuration indicates an association between the pre-emption indication fields and a set of layers,
    wherein a layer included in the set of layers is associated with the scheduled communication.

21. The method of claim 16, wherein the configuration is indicated in a radio resource control (RRC) message.

22. The method of claim 16, wherein the sets of TCI states correspond to a single transmit receive point (TRP) or a single panel in communication with the UE.

23. The method of claim 16, wherein the DCI includes one or more pre-emption indications, including the pre-emption indication, for multiple transmit receive points (TRPs) or multiple panels.

24. The method of claim 16, wherein the DCI includes one or more pre-emption indications, including the pre-emption indication, for only a single transmit receive point (TRP) or a single panel.

25. The method of claim 16, wherein the sets of TCI states correspond to a set of quasi co-location (QCL) relationships.

26. A user equipment (UE) for wireless communication, comprising:
    a memory; and
    one or more processors coupled to the memory, the one or more processors configured to:
        receive a configuration that indicates an association between pre-emption indication fields and sets of transmission configuration indicator (TCI) states,
            wherein a first pre-emption indication field and a second pre-emption indication field, of the pre-emption indication fields, correspond to a first set of TCI states and a second set of TCI states, of the sets of TCI states, respectively, and
            wherein the first pre-emption indication field is different from the second pre-emption indication field, and the first set of TCI states is different from the second set of TCI states;
        receive, based at least in part on receiving the configuration, downlink control information (DCI) that includes a pre-emption indication that is indicated as a set of bits in the first pre-emption indication field or the second pre-emption indication field,
        wherein each bit of the set of bits corresponds to a different symbol of a plurality of consecutive symbols;
        determine whether the UE is scheduled to receive a communication in one or more pre-empted resources indicated by the set of bits, via a component carrier associated with the first pre-emption indication field or the second pre-emption indication field, and using a TCI state included in the first set of TCI states or the second set of TCI states; and
        decode the communication based at least in part on the determination.

27. The UE of claim 26, wherein the sets of TCI states correspond to a single transmit receive point or a single panel in communication with the UE.

28. A network node for wireless communication, comprising:
    a memory; and
    one or more processors coupled to the memory, the one or more processors configured to:
        transmit a configuration that indicates an association between pre-emption indication fields and sets of transmission configuration indicator (TCI) states,
            wherein a first pre-emption indication field and a second pre-emption indication field, of the pre-emption indication fields, correspond to a first set of TCI states and a second set of TCI states, of the sets of TCI states, respectively, and
            wherein the first pre-emption indication field is different from the second pre-emption indication field, and the first set of TCI states is different from the second set of TCI states;
        determine, based at least in part on the transmitting, that a scheduled communication, associated with a TCI state of the first set of TCI states or the second set of TCI states, is pre-empted for a user equipment (UE); and transmit downlink control information (DCI) that includes a pre-emption indication, that is indicated as a set of bits in the first pre-emption indication field or the second pre-emption indication field, using a component carrier associated with the first pre-emption indication field or the second pre-emption indication field, based at least in part on the determination, wherein the pre-emption indication indicates one or more pre-empted resources in which the scheduled communication is pre-empted for the UE, and wherein each bit of the set of bits corresponds to a different symbol of a plurality of consecutive symbols.

29. The UE of claim 26, wherein the configuration indicates an association between the pre-emption indication fields and at least one of a set of demodulation reference signal (DMRS) ports or a set of layers, wherein a DMRS port, included in the set of DMRS ports, or a layer, included in the set of layers, is used to determine whether the UE is scheduled to receive the communication.

30. The network node of claim 28, wherein the configuration indicates an association between the pre-emption indication fields and at least one of a set of demodulation reference signal (DMRS) ports or a set of layers, wherein a DMRS, included in the set of DMRS ports, or a layer, included in the set of layers, is associated with the scheduled communication.

\* \* \* \* \*